(12) United States Patent
Hazama et al.

(10) Patent No.: US 6,228,717 B1
(45) Date of Patent: May 8, 2001

(54) METHOD OF MANUFACTURING SEMICONDUCTOR DEVICES WITH ALLEVIATED ELECTRIC FIELD CONCENTRATION AT GATE EDGE PORTIONS

(75) Inventors: Hiroaki Hazama, Tokyo; Kazumi Amemiya; Toshiharu Watanabe, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/196,002

(22) Filed: Nov. 19, 1998

(30) Foreign Application Priority Data

Nov. 20, 1997 (JP) .................................................. 9-319706

(51) Int. Cl.$^7$ .............................................. H01K 21/8247
(52) U.S. Cl. .......................................... 438/265; 438/593
(58) Field of Search .................................. 438/257–267, 438/593–594

(56) References Cited

U.S. PATENT DOCUMENTS

| | | | |
|---|---|---|---|
| 5,051,794 | | 9/1991 | Mori . |
| 5,208,174 | * | 5/1993 | Mori . |
| 5,208,175 | * | 5/1993 | Choi et al. . |
| 5,384,272 | * | 1/1995 | Ibok et al. . |
| 5,427,968 | * | 6/1995 | Hong . |
| 5,545,578 | * | 8/1996 | Park et al. . |
| 5,633,184 | * | 5/1997 | Tamura et al. ........................ 438/264 |
| 5,739,066 | * | 4/1998 | Pan ....................................... 438/595 |
| 5,847,427 | * | 12/1998 | Hagiwara ............................. 257/324 |
| 5,897,353 | * | 4/1999 | Kim et al. ............................ 438/261 |
| 5,976,934 | * | 11/1999 | Hayakawa ............................ 438/258 |
| 6,001,719 | * | 12/1999 | Cho et al. ............................. 438/592 |
| 6,017,809 | * | 1/2000 | Inumiya et al. ...................... 438/585 |

* cited by examiner

Primary Examiner—Richard Booth
(74) Attorney, Agent, or Firm—Hogan & Hartson, LLP

(57) ABSTRACT

With the present invention, in a memory cell of a stacked-gate NOR flash EEPROM, for example, a SiON film is selectively formed on the sidewalls of a floating gate electrode and the top surface and sidewalls of a control gate electrode. Thereafter, annealing is done in an oxidative atmosphere, thereby carrying out a post-oxidation process. This allows an oxide film to grow gradually at the gate edge portions contacting a tunnel oxide film or interlayer insulating film of the floating gate electrode and control gate electrode. The formation of the SiON film on at least on the sidewalls of the floating gate electrode prevents oxidation at those portions. On the other hand, the gate edge portions of the floating gate electrode eventually become round. By improving the shape of the gate edge portions of the floating gate electrode in this way, an electric field is prevented from concentrating at the gate edge portions of the floating gate electrode.

32 Claims, 5 Drawing Sheets

METHOD OF MANUFACTURING SEMICONDUCTOR DEVICES WITH ALLEVIATED ELECTRIC FIELD CONCENTRATION AT GATE EDGE PORTIONS

BACKGROUND OF THE INVENTION

This invention relates to a method of manufacturing MOS (Metal Oxide Semiconductor) devices where gate electrodes are formed on a gate insulating film covering the main surface of a semiconductor substrate. More particularly, this invention relates to improvements in the shape of the gate edge portions of a gate electrode (or at least the corners on the source or drain region side where the bottom and sidewalls of a gate electrode meet each other).

In the manufacture of LSI (Large Scale Integrated) devices, the gate electrodes of MOSFETs have generally been formed by RIE (Reactive Ion Etching) techniques and then subjected to post-oxidation. Specifically, when polycrystalline silicon has been used as an electrode material, the polycrystalline silicon is left bare immediately after the gate electrodes were etched. The gate oxide film under the gate electrodes (especially near the etched sections) has been damaged during the etching. Therefore, post-oxidation is necessary to recover the gate oxide film from damage and coat the gate electrodes (polycrystalline silicon) with insulating films.

Especially in the case of a nonvolatile memory with a stacked gate structure, electric charges are retained in the floating gate electrode and the quality of the gate oxide film (or tunnel oxide film) near the gate edge portion s of the floating gate electrode has a great effect on the device characteristics. Consequently, it is important to recover the tunnel oxide film from damage by post-oxidation.

FIGS. 1A and 1B schematically show th e processes related to post-oxidation in the manufacture of conventional MOSFETs. For example, after the processes (not shown) of forming well region and element isolating regions, a gate oxide film 101 is formed on the main surface of a semiconductor substrate 102. After a gate electrode 103 has been formed on the gate oxide film 102 (see FIG. 1A), post-oxidation is effected. In the post-oxidation process, an oxidizing agent 104 is applied all over the gate electrode 103, which not only recovers the gate oxide film 102 from damage caused by the formation of the gate electrode 103 but also coats the gate electrode 103 with an insulating film 105 (see FIG. 1B).

With the conventional MOSFET however, its structure allows the oxidizing agent 104 to be supplied sufficiently to the sidewalls of the gate electrode 103 but less sufficiently to the gate edge portions 103a contacting the gate oxide film 102. In addition, the effect of stress makes the speed of oxidation at the gate edge portions 103a lower than the speed of oxidation at the sidewalls of the gate electrode 103. As a result, for example, as shown in FIG. 1B, the insulating film 105 grows on the sidewalls of the gate electrode 103 differently from the gate edge portions 103a, which makes the shape of the gate edge portions 103a tend to sharpen. Since an electric field concentrates on the sharp portions, the gate oxide film 102 deteriorates heavily at those portions, resulting in a decrease in the reliability of the device.

In the case of NOR flash EEPROMs (Electrically Erasable Programmable Read-Only memories), stacked-gate nonvolatile memories, the controllability of the erase threshold value is important. For example, the efficiency of emitting electrons from the floating electrode to the diffused layer on the source region side depends largely on the shape of the floating gate and the thickness of the tunnel oxide film. Particularly depending on the shape of the gate edge portions of the floating gate electrode, the erasing speed (the erase threshold value) varies greatly, having an adverse effect on the operation of the device. Specifically, the data in a NOR flash EEPROM is erased by applying a strong electric field to the overlap region of the source region and the floating gate electrode and pulling electrons out of the floating gate into the source region. Therefore, when the gate edge portions of the floating gate electrode are sharp, or when the gate edge portions have a shape on which an electric field is liable to concentrate, the erase current density depends on the shape, permitting the erasing speed to vary greatly.

FIG. 2 schematically shows the configuration of a memory cell in an ordinary NOR flash EEPROM. In the cell, for example, an n-type source region 202 and an n-type drain region 203 are selectively formed at the surface of a p-type semiconductor substrate 201. A tunnel oxide film 205 is provided above the p-type semiconductor substrate 201 and on a channel region 204 between the source region 202 and drain region 203. On the tunnel oxide film 205, a floating gate electrode 206 is provided. On the floating gate electrode 206, an interlayer insulating film 207 is provided. On the interlayer insulating film 207, a control gate electrode 208 is provided. A structure composed of the floating gate electrode 206, control gate electrode 208, and interlayer insulating film 207 is coated all over with an oxide film 209.

With the memory cell in the NOR flash EEPROM constructed as described above, when the data is erased, a negative potential (e.g., −10V) is applied to the control gate electrode 208 and a positive potential (e.g., +5V) is applied to the source region 202. Then, F-N tunnel current (indicated by a solid line 301) flowing from the vicinity of the center of the floating gate electrode 206 extracts electrons held in the floating gate electrode 206 into the source region 202. This erases the data.

When the gate edge portions of the floating gate electrode 206 are sharp, an electric field concentrates on the sharp gate edge portions, which permits F-N tunnel current flowing there (indicted by a broken line 302) to increase. When the F-N tunnel current 302 is dominant over the original erase current (F-N tunnel current 301), the erasing speed at the cell is higher than that in the other cells.

BRIEF SUMMARY OF THE INVENTION

The object of the present invention is to provide a semiconductor device manufacturing method capable of alleviating the concentration of an electric field on the gate edge portions of a gate electrode and thereby improving the device characteristics.

The foregoing object is accomplished by providing a method of manufacturing a semiconductor device, comprising: a first step of forming a gate electrode section on an insulating film provided on a semi-conductor substrate; a second step of forming an SiN film or an SiON film at least on a sidewall of the gate electrode section; and a third step of carrying out a thermal oxidation process after the second step to selectively promote oxidation at an edge portion of the gate electrode section adjacent to the insulating film.

With the semiconductor device manufacturing method according to the present invention, not only is the insulating film recovered from damage caused by the formation of the gate electrode section, but also an oxide film is selectively formed thicker on the gate edge sections of the gate electrode section contacting the insulating film. This enables the gate edge portions of the gate edge electrode section to be formed into a shape on which an electric field is difficult to concentrate.

Especially when a nitride film or an oxy nitride film is selectively formed, nitriding or oxy-nitriding at low temperatures for a short time enables only the polycrystalline silicon on the sidewalls of the gate electrode section to be nitrided (or oxy-nitrided) effectively, without nitriding (or oxy-nitriding) a gate insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

(First Embodiment)

FIGS. 3A to 3F show a case where a method of manufacturing semiconductor devices according to a first embodiment of the present invention has been applied to a stacked-gate NOR flash EEPROM.

Figure 1A:
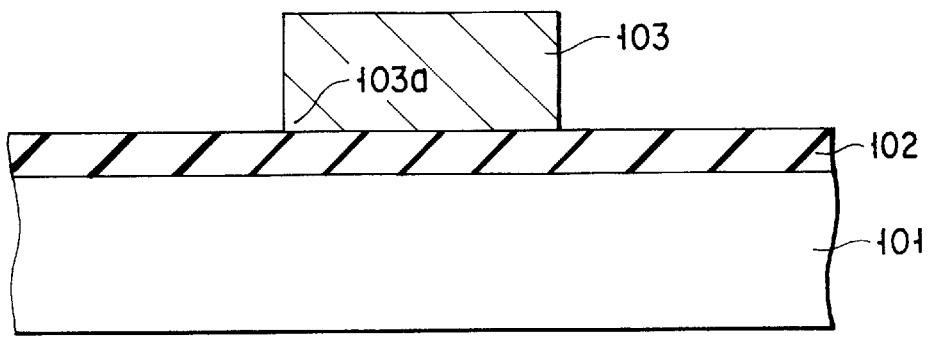
FIGS. 1A and 1B are schematic sectional views of a conventional MOSFET to help explain the processing related to post-oxidation.
Figure 1B:
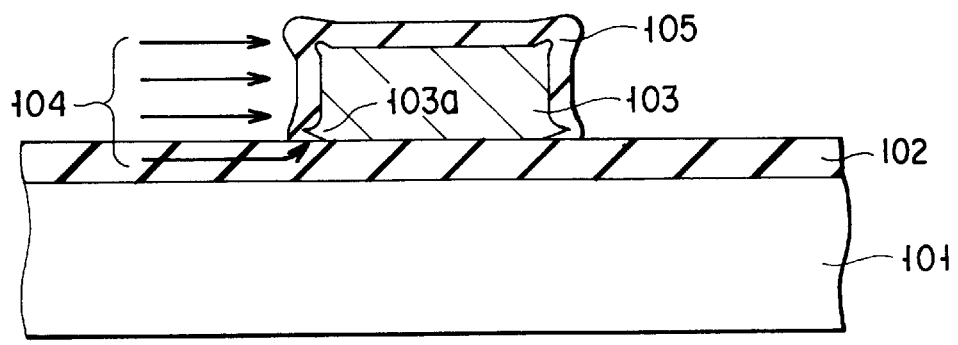
Figure 2:
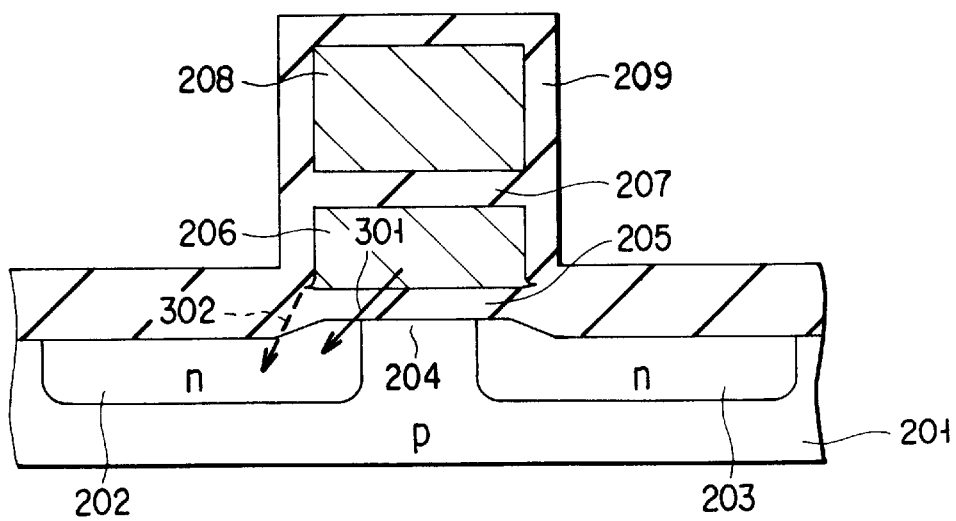
FIG. 2 is a schematic sectional view of the main portion of a memory cell in an ordinary NOR flash EEPROM.
Figure 3A:
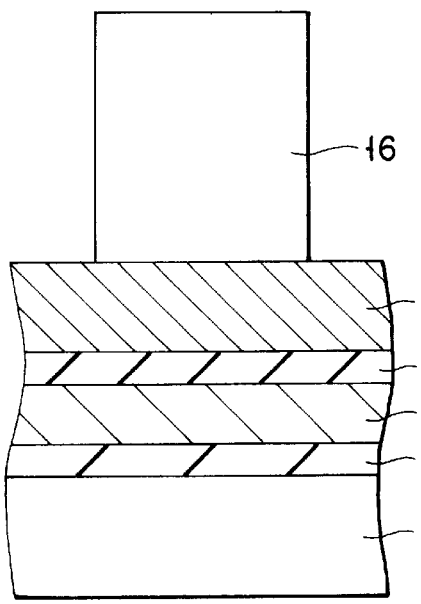
FIGS. 3A to 3F are sectional views to help explain a case where a method of manufacturing semiconductor devices according to a first embodiment of the present invention has been applied to a stacked-gate NOR flash EEPROM.

First, as shown in FIG. 3A, an element region is formed at the surface of a semiconductor substrate 11 after the formation of a well region (not shown) and that of an element isolating region (not shown). Then, by thermal oxidation techniques, a tunnel oxide film (or insulating film) 12 is formed on the semiconductor substrate 11 corresponding to the element region. Thereafter, a first-layer polycrystalline silicon film 130 serving as a floating gate electrode is deposited. Phosphorus is defused so that the impurity concentration in the film 130 may be $5 \times 10^{20}$ cm$^{-3}$ or less. Although not shown, the polycrystalline silicon film 130 is formed into a slit pattern on the element isolating region. Then, an ONO film (a stacked film of SiO/SiN/SiO) making an interlayer insulating film is deposited on the polycrystalline silicon film 130. Then, a second-layer polycrystalline silicon film (or a stacked film of a polycrystalline silicon film and a high-melting-point metallic silicide film) making a control gate electrode is deposited. In the polycrystalline silicon film, phosphorus is diffused as impurities.

Then, a resist pattern 16 for forming gate electrodes is formed on the polycrystalline silicon film 150 by ordinary lithographic techniques. With the resist pattern 16 as a mask, the polycrystalline silicon film 150, ONO film 140, and polycrystalline silicon film 130 are patterned by, for example, RIE techniques. This completes the formation of a gate electrode section 10 composed of the floating gate electrode 13, interlayer insulating film 14, and control gate electrode 15 stacked one on top of another in that order on the tunnel oxide film 12 as shown in FIG. 3B.

Figure 3B:
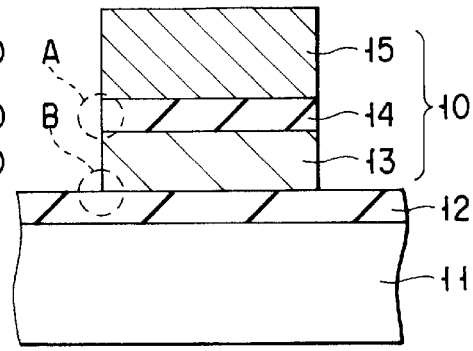

In this case, the insulating properties of the interlayer insulating film 14 and tunnel oxide film 12 at region A and region B near the etched surfaces in FIG. 3B have deteriorated because of damage by RIE techniques in forming the gate electrode. In the gate edge portion of the gate electrode section 10 in area B, the floating gate electrode 13 has been formed so at to stand almost perpendicular to the semiconductor substrate 11 and has a shape on which an electric field is liable to concentrate. To recover the insulating properties of the interlayer insulating film 14 and tunnel oxide film 12 from the deterioration and improve the shape of the floating gate 13 electrode on which an electric field is liable to concentrate, post-oxidation is effected.

The resist pattern 16 is removed by incinerating the resist in an atmosphere of oxygen plasma. After the resist pattern 16 has been removed, metal impurities are removed by carrying out a pre-processing step which is generally effected before the post-oxidation process and in which the semiconductor substrate 11, together with the wafer, is immersed in acid, such as hydrochloric acid.

Figure 3C:
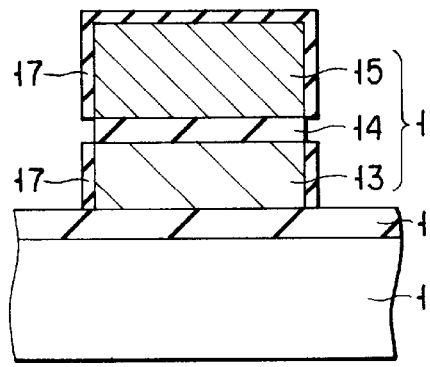

In the pre-processing step, as shown in FIG. 3C, a natural oxide film 17 of a thickness of about 20 to 30 angstroms grows on the sidewalls of the floating gate electrode 13 and on the top surface and sidewalls of the control gate electrode 15. Even when such a pre-processing step is not carried out, a natural oxide film 17 is generally formed on the sidewalls of the floating gate electrode 13 and the top surface and sidewalls of the control gate electrode 15.

Figure 3D:
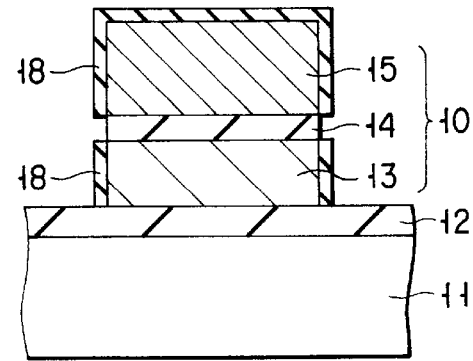

Then, to form a film having the effect of preventing oxidation on at least the sidewalls of the floating gate electrode 13, annealing is done at 700° C. for 60 minutes in an atmosphere of, for example, NH$_3$. As shown in FIG. 3D, this turns the natural oxide film 17 on the sidewalls of the floating gate electrode 13 and the top surface and sidewalls of the control gate electrode 15 into an SiON film 18, an oxy nitride film. At that time, the natural oxide film 17 is easily turned into the SiON film 18, whereas the tunnel oxide film 12 and interlayer insulating film 14 are not influenced by NH$_3$. This enables the SiON film 18 acting as a film having the effect of preventing oxidation to be selectively formed only on the sidewalls of the floating gate electrode 13 and the top surface and sidewalls of the control gate electrode 15.

Figure 3E:
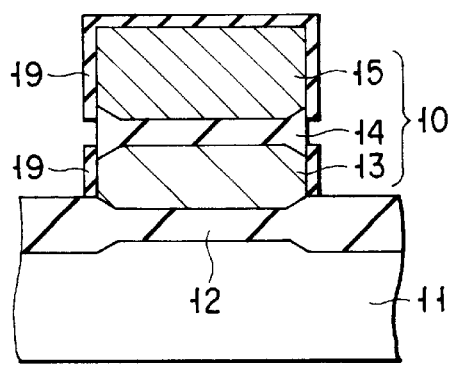
Figure 3F:
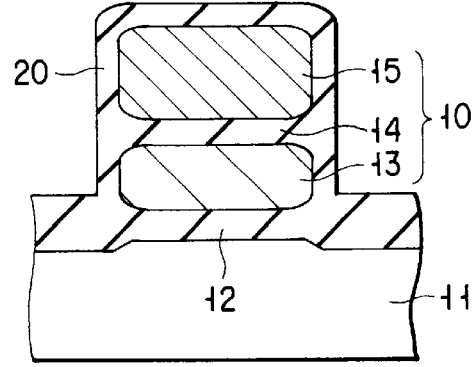

Then, with the SiON film 18 selectively formed on the sidewalls of the floating gate electrode 13 and the top surface and sidewalls of the control gate electrode 15, post-oxidation is carried out by effecting annealing in an oxidative atmosphere. In this case, for example, as shown in FIG. 3E, an oxide film (or the tunnel oxide film 12 and interlayer insulating film 14) grow gradually only at the gate edge portions contacting the tunnel oxide film 12 or interlayer insulating film 14 of the floating gate electrode 13 and control gate electrode 15. Specifically, the SiON film 18 formed on the sidewalls of the floating gate electrode 13 and the top surface and sidewalls of the control gate electrode 15 prevents oxidation at those portions. On the other hand, the gate edge portions of the floating gate electrode 13 and control gate electrode 15 are selectively oxidized, which allows an oxide film to grow thick in such a manner that each corner section becomes round.

While annealing is being done in the oxidative atmosphere, the SiON film 18 on the sidewalls of the floating gate electrode 13 and the top surface and sidewalls of the control gate electrode 15 are oxidized gradually and turn into a silicon oxide film 19.

As the oxide film grows at the gate edge portions of the floating gate electrode 13 and control gate electrode 15, the tunnel oxide film 12 excluding the central portion (or channel region) of the gate electrode section 10 grows simultaneously and becomes thicker.

By reference to FIGS. 4A and 4B, the post-oxidation will be explained by comparing a case where no SiON film 18 has been formed on the sidewalls of the floating gate electrode 13 with a case where the SiON film 18 has been formed.

Figure 4A:
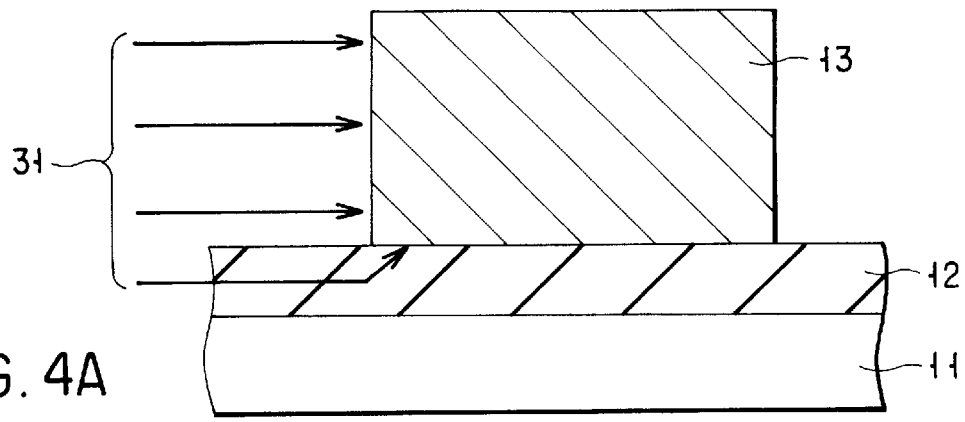
FIGS. 4A and 4B are sectional views to help explain the processing in the post-oxidation step.

For example, when no SiON film 18 has been formed on the sidewalls of the floating gate electrode 13, an oxidizing agent 31 is supplied equally to the sidewalls of the floating gate electrode 13 as shown in FIG. 4A. At that time, part of the oxidizing agent 31 is supplied to the gate edge portions of the floating gate electrode 13 as a result of the oxidizing agent 31 diffusing in the tunnel oxide film 12. Since the gate edge portions of the floating gate electrode 13 have a small solid angle for the supply of the oxidizing agent 31, the oxidizing agent 31 supplied to those portions is less than that to the sidewalls. As a result, the sidewalls of the floating gate electrode 13 are mainly oxidized and the gate edge portions are hardly oxidized.

Figure 4B:
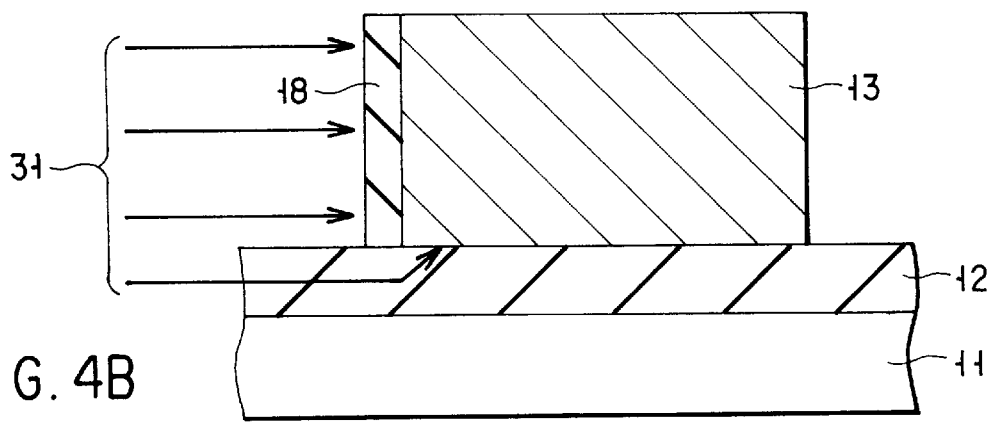

In contrast, when SiON film 18 has been formed on the sidewalls of the floating gate electrode 13, the SiON film 18 prevents the oxidizing agent 31 from being supplied to the sidewalls as shown in FIG. 4B. As a result, the oxidizing agent 31 is hardly supplied to the sidewalls. On the other hand, the oxidizing agent 31 diffuses in the tunnel oxide film 12 and part of the agent 31 is supplied to the gate edge portions of the floating gate electrode 13. As a result, the sidewalls of the floating gate electrode 13 are hardly oxidized and the gate edge portions are gradually oxidized. As described above, providing the SiON film 18 on the sidewalls of the floating gate electrode 13 prevents the sidewalls from being oxidized and enables only the gate edge portions to be selectively oxidized.

In the post-oxidation, further continuing the annealing in the oxidative atmosphere causes the gate edge portions of the floating gate electrode 13 and control gate electrode 15 to eventually have round corners, on which an electric field is difficult to concentrate.

As the SiON film 18 is turned into the silicon oxide film 19, the oxidizing agent 31 starts to be supplied to both the sidewalls of the floating gate electrode 13 and the top surface and sidewalls of the control gate electrode 15. This allows the sidewalls of the floating gate electrode 13 and the top surface and sidewalls of the control gate electrode 15 to be oxidized, which enables an oxide film (or insulating film) 20 to grow thick in such a manner that it covers the gate electrode section 10 all over.

As described above, when the SiON film 18 has been formed on the sidewalls of the floating gate electrode 13 and the top surface and sidewalls of the control gate electrode 15 before the post-oxidation process, this enables RIE techniques to be used not only to restore the insulating properties of the interlayer insulating film 14 and tunnel oxide film 12 but also to coat the gate electrode section 10 with the oxide film 20 and improve the shape of the gate edge portions of the floating gate 13 on which an electric field is liable to concentrate.

Thereafter, with the gate electrode section 10 as a mask, a diffused layer acting as a source region and a drain region is formed in the element region at the surface of the semiconductor substrate 11 and other usual NOR flash EEPROM manufacturing processes are carried out. This completes a memory cell excellent in device characteristics.

Figure 5:
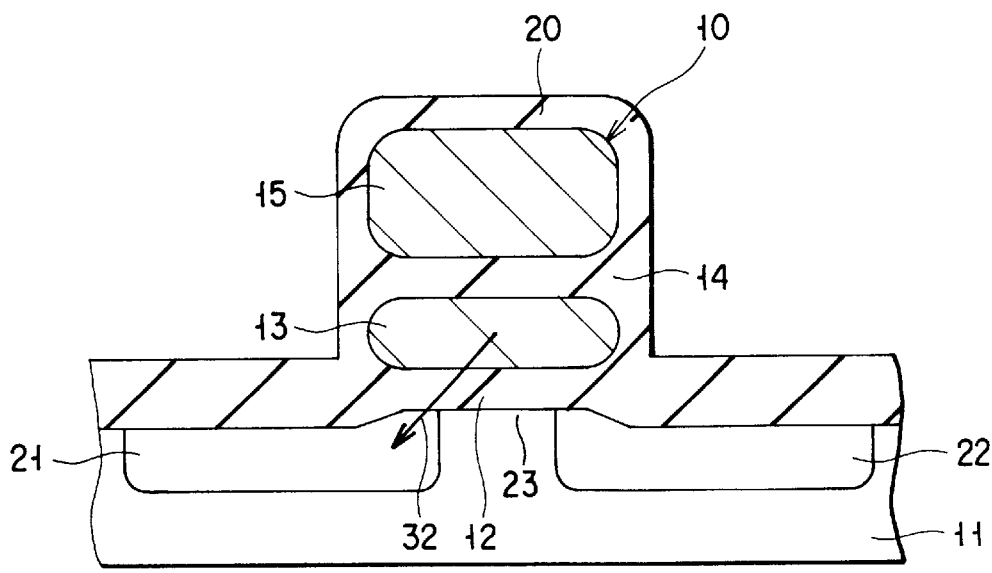
FIG. 5 is a schematic sectional view of the main portion of a memory cell in the NOR flash EEPROM.

FIG. 5 schematically shows the configuration of a memory cell in a NOR flash EEPROM manufactured through the above-described processes. Specifically, for example, the cell has a gate electrode section 10 formed on the tunnel oxide film 12 in an element region of the semiconductor substrate 11. The gate electrode section 10 is constructed by stacking a floating gate electrode 13, an interlayer insulating film 14, and a control gage electrode 15 one on top of another in that order. In the gate electrode section 10, each corner of the gate edge portions of the floating gate electrode 13 and control gate electrode 15 is round and therefore has a shape on which an electric field is difficult to concentrate. The outer surface of the gate electrode section 10 including the gate edge portions are protected by the oxide film 20. The source region 21 and drain region 22 are selectively formed at the surface of the semiconductor substrate 11 excluding the gate electrode section 10. A channel region 23 is formed just under the gate electrode section 10 and between the source region 21 and drain region 22.

With the memory cell constructed as described above, when the data is erased, a negative potential (e.g., −10V) is applied to the control gate electrode 15 and a positive potential (e.g., +5V) is applied to the source region 21. This permits an F-N tunnel current (the original erase current 32) to flow through the overlap region of the floating gate electrode 13 and source region 21, pulling the electrons out of the floating gate electrode 13 into the source region 21, which thereby erases the data.

In the memory cell, the gate edge portions on the source region 21 side of at least the floating gate electrode 13 in the gate electrode section 10 have round corners, on which an electric field is difficult to concentrate. Therefore, there is no possibility that the concentration of an electric field will permit an F-N tunnel current flowing from the vicinity of the gate edge portions of the floating gate electrode 13 to be dominant over the original erase current 32.

The following is an explanation of the shape of the gate edge portions of the floating gate electrode 13 capable of preventing an F-N tunnel current from the vicinity of the gate edge portions of the floating gate electrode 13 from being dominant over the original erase current. The explanation will be given by reference to FIG. 6.

For example, it is assumed that the gate edge portions on the source region 21 side are approximated by a cylindrical conductor (with a radius of r and a potential of V) separated the thickness Tox of the tunnel oxide film 12 from a flat surface 41 with the source region 21 as a grounding conductor.

Figure 6:
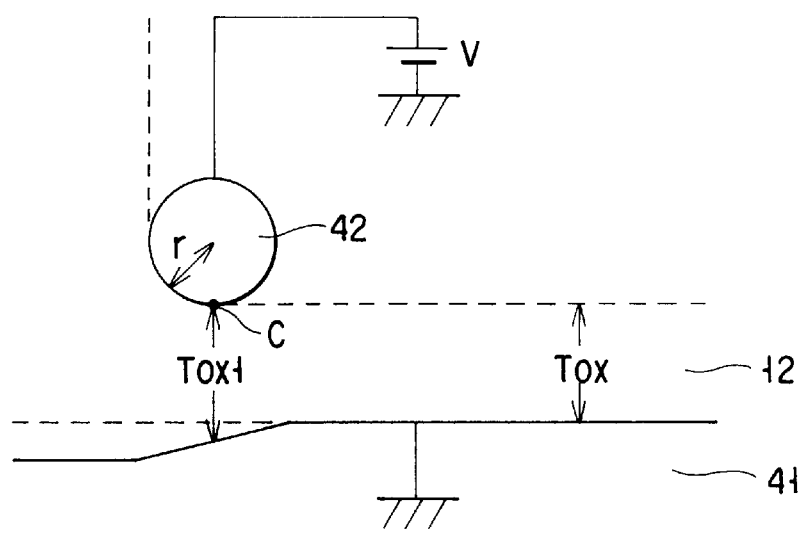
FIG. 6 schematically shows the shape of a gate edge portion of the floating gate electrode.

Then, an electric field E on the cylindrical conductor 42 represented by point C in FIG. 6 will be expressed by equation (1):

$$E = \sqrt{1 + r/Tox} \frac{V/r}{\cosh^{-1}(1 + (Tox/r))} \quad (1)$$

Dividing equation (1) by the electric field V/Tox of the original erase current gives the quotient FEF (Field Enhanced Factor), which will be expressed by equation (2):

$$FEF = \frac{\sqrt{1 + r/Tox}}{r/Tox} \frac{1}{\cosh^{-1}(1 + (Tox/r))} \quad (2)$$

As a result, when FEF>1, the concentration of an electric field permits an F-N tunnel current density from the vicinity of the gate edge portions of the floating gate electrode 13 to be higher than the original erase current density.

Figure 7:
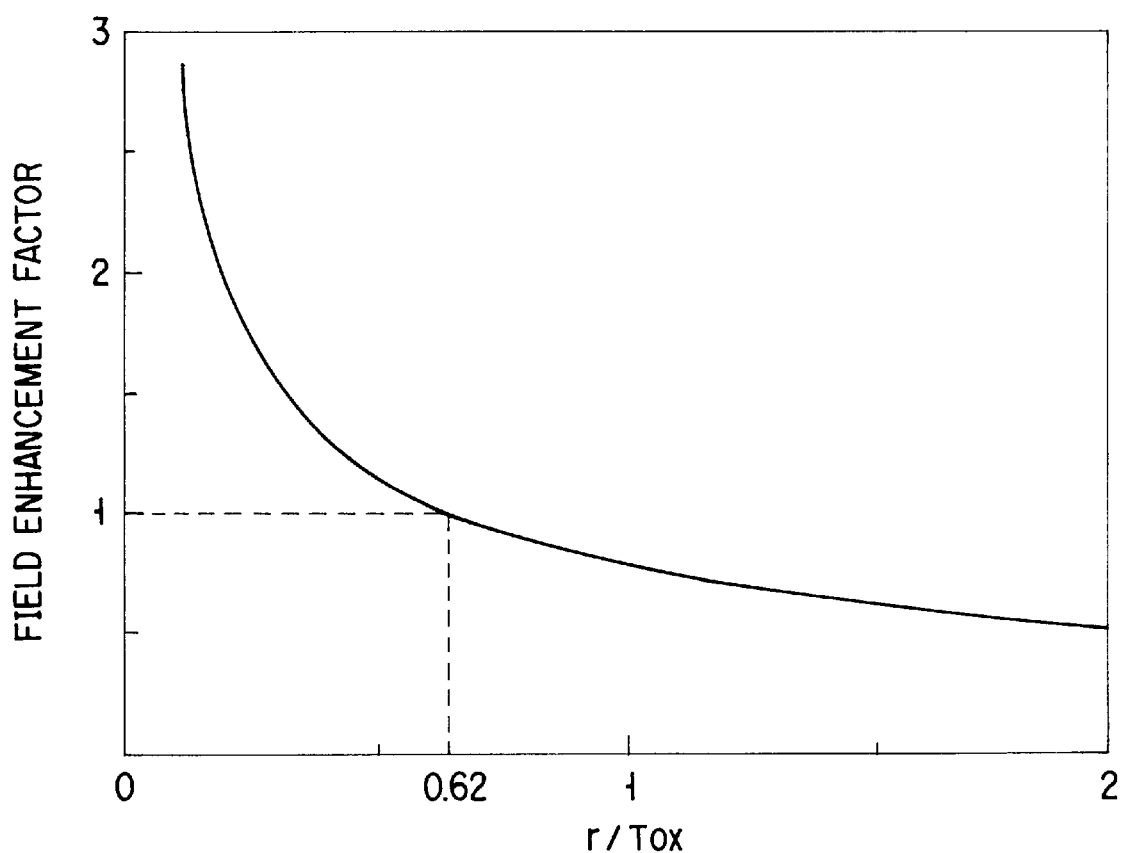
FIG. 7 shows the relationship between field enhancement factor and the radius of curvature of the floating gate electrode with respect to the thickness of the tunnel oxide film.
Figure 8A:
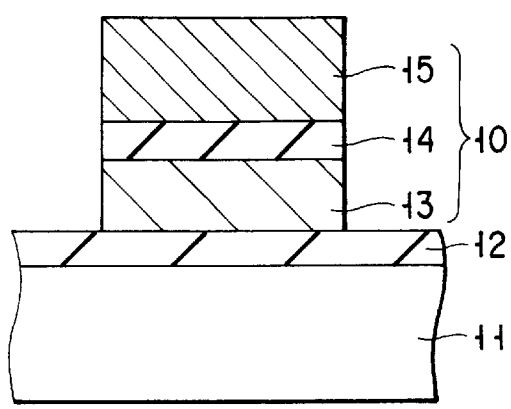
FIGS. 8A to 8D are sectional views to help explain a case where a method of manufacturing semiconductor devices according to a second embodiment of the present invention has been applied to a stacked-gate NOR flash EEPROM.
Figure 8B:
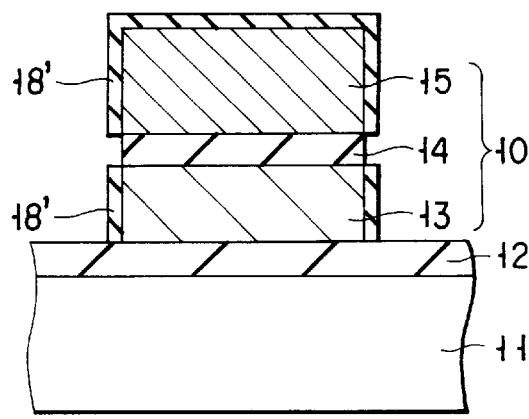
Figure 8C:
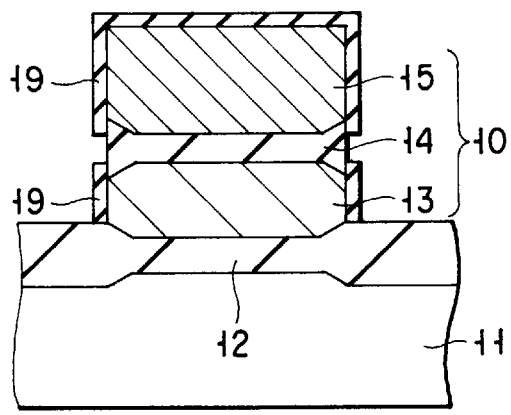
Figure 8D:
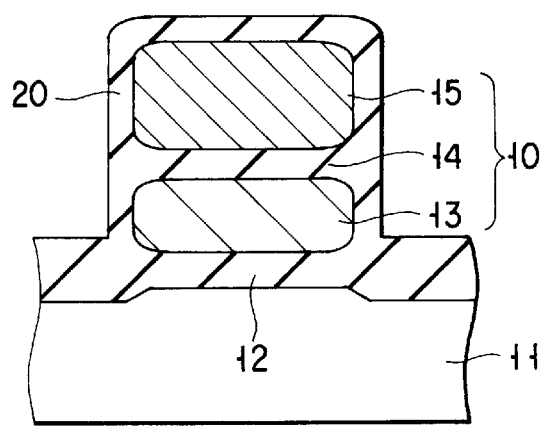

FIG. 7 is a graph of equation (2). As seen from the figure, when the expression r<0.62 Tox is fulfilled, the expression FEF>1 is met. Therefore, when the gate edge portions on the source region 21 side of the floating gate electrode 13 are formed into such a shape as fulfills the following equation (3), this prevents the concentration of an electric field from permitting an F-N tunnel current from the vicinity of the gate edge portions of the floating gate electrode 13 to be dominant over the original erase current:

$$r \geq 0.62\ Tox \quad (3)$$

Actually, the distance between point C and the flat surface in FIG. 6 is expected to be larger than the thickness Tox of the tunnel oxide film 12 before the post-oxidation process because the tunnel oxide film 12 grows through post-oxidation. For example, with the thickness of the tunnel oxide film 12 after the post-oxidation process being twice the thickness Tox of the original tunnel oxide film 12, when FEF>2, the concentration of an electric field permits an F-N tunnel current density from the vicinity of the gate edge portions of the floating gate electrode 13 to be higher than the original erase current density. Specifically, if the distance between point C and the flat surface 41 after post-oxidation (or the thickness of the tunnel oxide film 12 just under the gate edge portions after post-oxidation) is Tox1, the concentration of an electric field will be prevented from permitting an F-N tunnel current from the vicinity of the gate edge portions of the floating gate electrode 13 to be dominant over the original erase current, by forming the gate edge portions on the source region 21 side of the floating gate electrode 13 into such a shape as fulfills the following equation (4):

$$\frac{r}{Tox} \geq \frac{\sqrt{1 + r/Tox1}}{\cosh^{-1}(1 + (Tox1/r))} \quad (4)$$

Specifically, in FIG. 5, when the gate edge portions on the source region 21 side of at least the floating gate electrode 13 of the gate electrode section 10 are subjected to the post-oxide process to fulfill equation (4) in such a manner that they have round corners on which an electric field is difficult to concentrate, the concentration of an electric field is prevented from permitting an F-N tunnel current from the vicinity of the gate edge portions of the floating gate electrode 13 to be dominant over the original erase current. As a result, the deterioration of the tunnel oxide film 12 is prevented.

Not only is the deterioration of the tunnel oxide film 12 prevented, but also variations in the erase threshold value (or the erasing speed) for each cell are suppressed, which prevents an overerased cell from appearing. Specifically, when a cell whose erasing speed is particularly fast, the cell will be overerased. The appearance of the overerased cell contributes to erroneous read operations. For example, when the data in an unselected cell is overerased, the cell is always in the on state. This permits current to flow through a bit line, preventing the data in the selected cell from being read properly. The round corners prevent the appearance of an overerased cell contributing to erroneous read operations.

As described above, with the first embodiment, not only is the tunnel oxide film recovered from damage, but also an oxide is selectively formed on the gate edge portions contacting the tunnel oxide film of the floating gate. Specifically, an SiON film having an oxidation preventing effect is formed on the sidewalls of the floating gate electrode and the top surface and sidewalls of the control gate electrode. This prevents oxidation at those portions, while allowing oxidation to progress gradually from the gate edge portions of the floating gate electrode and control gate electrode. This facilitates the formation of round corners at the gate edge portions on the source region side of the floating gate electrode. Since an electric field is difficult to concentrate on the round corners, the post-oxidation improves the degraded shape of the gate edge portions of the floating gate electrode. This prevents the concentration of an electric field from permitting an F-N tunnel current during erasure to locally increase, preventing the erase threshold value for each cell from varying, which improves the device characteristics remarkably.

In the first embodiment, the SiON film has been formed by selectively nitriding the natural oxide film formed on the sidewalls of the floating gate electrode and the top surface and sidewalls of the control gate electrode. The present invention is not limited to this. For instance, after the natural oxide film has been removed, a new SiON film may be formed.

(Second Embodiment)

FIGS. 8A to 8D schematically show a method of manufacturing semiconductor devices according to a second embodiment of the present invention, taking a stacked-gate NOR flash EEPROM as an example. Because the processes up to the formation of a natural oxide film by pre-processing are the same as those in FIGS. 3A to 3C, only the subsequent processes will be explained.

In a state where a natural oxide film 17 has been formed on the sidewalls of the floating gate electrode 13 and the top surface and sidewalls of the control gate electrode 15 in a pre-processing step (see FIG. 3C), the natural oxide film 17 is removed from the sidewalls of the floating gate electrode 13 and the top surface and sidewalls of the control gate electrode 15 by using a dilute HF solution (see FIG. BA).

Then, an SiN film 18' having the effect of preventing oxidation is formed on the sidewalls of the floating gate electrode 13 and the top surface and sidewalls of the control gate electrode 15 at which polycrystalline silicon, an electrode material, has been exposed as a result of the removal of the natural oxide film 17. In this case, after the process of removing the natural oxide film 17 using the dilute HF solution, the semiconductor substrate 11, together with the wafer, is introduced into an LP-CVD (Low Pressure Chemical Vapor Deposition) furnace. After the natural oxide film formed at the time of the introduction has been removed in an atmosphere of hydrogen, annealing is done at 700° C. for 60 minutes in an atmosphere of $NH_3$. As a result, an SiN film 18', a nitride film, is formed on the sidewalls of the floating gate electrode 13 and the top surface and sidewalls of the control gate electrode 15. At that time, the exposed polycrystalline silicon easily turns into the SiN film 18', but neither the tunnel oxide film 12 nor interlayer insulating film 14 are influenced by $NH_3$. Therefore, the SiN film 18' acting as a film having the effect of preventing oxidation is selectively formed only on the sidewalls of the floating gate electrode 13 and the top surface and sidewalls of the control gate electrode 15.

Then, in a state where the SiN film 18' has been selectively formed on the sidewalls of the floating gate electrode 13 and the top surface and sidewalls of the control gate electrode 15, annealing is done in an oxidative atmosphere, thereby carrying out post-oxidation. During the annealing process in the oxidative atmosphere, the SiN film 18' on the sidewalls of the floating gate electrode 13 and the top surface and sidewalls of the control gate electrode 15 is gradually oxidized and turns into a silicon oxide film 19 (see FIG. 8C).

On the other hand, at the gate edge portions contacting the tunnel oxide film 12 or interlayer insulating film 14 of the floating gate electrode 13 and control gate electrode 15, an oxide film (or tunnel oxide film 12 and interlayer insulating film 14) gradually grows. As a result, the gate edge portions of the floating gate electrode 13 and control gate electrode 15 eventually have round corners, on which an electric field is difficult to concentrate.

As the oxide film grows at the gate edge portions of the floating gate electrode 13 and control gate electrode 15, the tunnel oxide film 12 excluding the central portion (or the channel region) of the gate electrode section 10 grows thick simultaneously.

In the post-oxidation step, when annealing is continued in the oxidative atmosphere, the oxidizing agent starts to be supplied to the sidewalls of the floating gate electrode 13 and the top surface and sidewalls of the control gate electrode 15 according to the turn of the SiN film 18' into the silicon oxide film 19. This permits oxidation to progress from the sidewalls of the floating gate electrode 13 and the top surface and sidewalls of the control gate electrode 15, enabling an oxide film (or insulating film) 20 to grow thick all over the gate electrode section 10 (see FIG. 8D).

As described above, in a case, too, where before the post-oxidation step, the SiN film 18' has been formed after the removal of the natural oxide film 17 on the sidewalls of the floating gate electrode 13 and the top surface and sidewalls of the control gate electrode 15, this enables RIE techniques to be used not only to restore the insulating properties of the interlayer insulating film 14 and tunnel oxide film 12 but also to coat the gate electrode 10 with the oxide film 20 and improve the shape of the gate edge portions of the floating gate 13 on which an electric field is liable to concentrate.

From this point on, the steps in the manufacture of ordinary NOR flash EEPROMs are carried out and memory cells excellent in device characteristics are completed.

While in the above embodiments, the SiN film or SiON film has been formed by annealing in an atmosphere of $NH_3$, a nitriding atmosphere, the present invention is not limited to this. For instance, an SiON film may be formed by annealing in an oxy nitriding atmosphere, such as an atmosphere of $N_2O$ gas or NO gas.

The film having the effect of preventing oxidation is not limited to the SiN film or SiON film obtained by nitriding or oxy-nitriding a polycrystalline silicon film, an electrode material. For instance, use of a deposited SiN film (nitrided film) produces a similar effect. In this case, after the process of removing the natural oxide film 17 by using a dilute HF solution, the semiconductor substrate 11, together with the wafer, is introduced into an LP-CVD furnace. With CVD techniques, a thin SiN film is deposited by using $NH_3$ gas and $SiH_4$ gas to form a deposited SiN film on the exposed silicon surface. The deposited SiN film is selectively deposited faster on the exposed silicon surface than on the surface of the tunnel oxide film 12 or interlayer insulating film 14. This enables the deposited SiN film preventing oxidation to be easily formed only on the sidewalls of the floating gate electrode 13 and the top surface and sidewalls of the control gate electrode 15.

A method of improving the shape of the gate edge portions of the floating gate without using a film having the effect of preventing oxidation can be realized by, for example, setting the concentration of phosphorus in the floating gate electrode at $5 \times 10^{20}$ cm$^{-3}$ or more. Specifically, when the concentration of phosphorus is made higher, the floating gate electrode is liable to be oxidized. This makes larger the radius r of curvature of the gate edge portions and the distance Tox1 between the gate edge portions and the semiconductor substrate in equation (4).

To fulfill equation (4), the post-oxidation step may be carried out in high-temperature dilute oxidation environment (for example, high-temperature annealing at 1000° C. or higher) or in oxidation environment including $NF_3$.

The adjustment of the concentration of phosphorus may be combined with one of the post-oxidation steps to meet equation (4).

Figure 9:
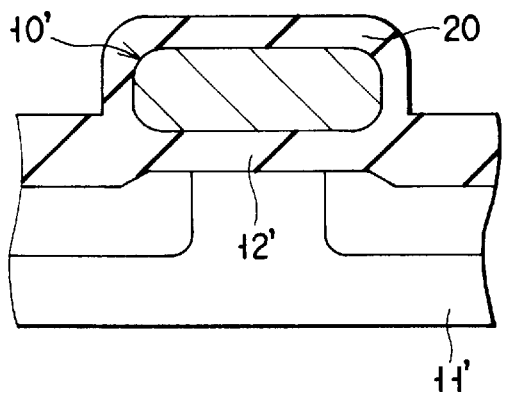
FIG. 9 is a sectional view of an example of the main portion of a MOSFET to which the present invention has been applied.
Figure 10:
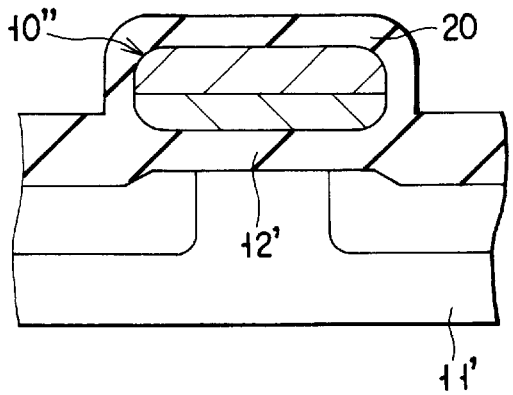
FIG. 10 is a sectional view of another example of the main portion of a MOSFET to which the present invention has been applied.

Furthermore, the present invention is not restricted to memory cells in a NOR flash EEPROM. For instance, the invention may be applied to a MOSFET (see FIG. 9) constructed by providing a gate oxide film 12' on a semiconductor substrate 11' and forming a gate electrode section 10' composed of a polycrystalline silicon film on the gate oxide film 12' or to a MOSFET (see FIG. 10) constructed by forming a gate electrode section 10" composed of a stacked layer of a polycrystalline silicon film and a high-melting-point metal silicide film on a gate oxide film 12'.

The present invention may be practiced or embodied in still other ways without departing from the spirit or essential character thereof.

As described above in detail, the formation of an oxide film is suppressed in the gate edge electrode excluding the gate edge portions, thereby allowing the oxide film to grow thicker at the gate edge portions. This improves the shape of the gate edge portions of the gate electrode in such a manner that the edge portions have a round shape on which an electric field is difficult to concentrate. Therefore, it is possible to provide a method of manufacturing semiconductor devices which can alleviate the concentration of an electric field at the gate edge portions of the gate electrode and improve the device characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

a first step of forming a gate electrode section on an insulating film provided on a semiconductor substrate, the gate electrode section having a stacked gate structure in which a floating gate electrode, an interlayer insulating film, and a control gate electrode are provided;

a second step of forming a SiN film at least on a sidewall portion of said floating gate electrode by nitriding a side surface of said gate electrode section, said SiN film having an oxidation prevention effect; and a third step of carrying out a thermal oxidation process after the second step to selectively promote oxidation at an edge portion of said floating gate electrode section adjacent to said insulating film.

2. A method of manufacturing a semiconductor device according to claim 1, further comprising a fourth step of forming an impurity diffused layer becoming a source region and a drain region at the surface of said semiconductor substrate using said gate electrode section as a mask.

3. A method of manufacturing a semiconductor device according to claim 1, wherein said floating gate electrode contains phosphorus having a concentration of $5\times10^{20}$ cm$^{-3}$ or more.

4. A method of manufacturing a semiconductor device according to claim 1, wherein said gate electrode section has a single-layer structure composed of a polycrystalline silicon film.

5. A method of manufacturing a semiconductor device according to claim 1, wherein said gate electrode section has a stacked structure composed of a polycrystalline silicon film and a high-melting-point metal silicide film.

6. A method of manufacturing a semiconductor device according to claim 1, wherein the edge portion of said gate electrode section is oxidized to fulfill the following expression:

$$r \geq 0.62 \, Tox$$

where r is the radius of curvature of the edge portion on the source region side of the gate electrode section, and Tox is the thickness of the insulating film.

7. A method of manufacturing a semiconductor device according to claim 1, wherein the edge portion of said gate electrode section is oxidized to fulfill the following expression:

$$\frac{r}{Tox} \geq \frac{\sqrt{1 + r/Tox1}}{\cosh^{-1}(1 + (Tox1/r))}$$

where r is the radius of curvature of the edge portion on the source region side of the gate electrode section, Tox is the thickness of the insulating film (in the central portion), and Tox1 is the thickness of the insulating film just under the edge portion of the gate electrode section.

8. A method of manufacturing a semiconductor device according to claim 1, wherein said SiN film is formed after a natural oxide film formed on the side surface of said gate electrode section has been removed.

9. A method of manufacturing a semiconductor device according to claim 1, wherein said SiN film is formed by deposition after a natural oxide film formed on the side surface of said gate electrode section has been removed.

10. A method of manufacturing a semiconductor device according to claim 1, wherein said SiN film prevents an oxidizing agent from being supplied to at least the side surface of said gate electrode section during said thermal oxidation process.

11. A method of manufacturing a semiconductor device according to claim 1, wherein said SiN film is turned into an oxide film by said thermal oxidation process.

12. A method of manufacturing a semiconductor device according to claim 1, wherein said thermal oxidation process is high-temperature dilute oxidation in which the temperature of annealing is 1000° C. or higher.

13. A method of manufacturing a semiconductor device according to claim 1, wherein said thermal oxidation process is oxidation in an environment including $NF_3$.

14. A method of manufacturing a semiconductor device, comprising:

a first step of forming a gate electrode section on an insulating film provided on a semiconductor substrate, the gate electrode section having a stacked gate structure in which a floating gate electrode, an interlayer insulating film, and a control gate electrode are provided;

a second step of forming a SiON film at least on a sidewall portion of said floating gate electrode by nitriding a natural oxide film formed on a side surface of said gate electrode section in a nitriding atmosphere, said SiON film having an oxidation prevention effect; and a third step of carrying out a thermal oxidation process after the second step to selectively promote oxidation at an edge portion of said floating gate electrode section adjacent to said insulating film.

15. A method of manufacturing a semiconductor device according to claim 14, further comprising a fourth step of forming an impurity diffused layer serving as a source region and a drain region at a surface of said semiconductor substrate, by using said gate elected section as a mask.

16. A method of manufacturing a semiconductor device according to claim 14, wherein said floating gate electrode contains phosphorus having a concentration of $5\times10^{20}$ cm$^{-3}$ or more.

17. A method of manufacturing a semiconductor device according to claim 14, wherein the edge portion of said gate electrode section is oxidized to fulfill the following expression:

$$r \geq 0.62 \, Tox$$

where r is the radius of curvature of the edge portion on the source region side of the gate electrode section, and Tox is the thickness of the insulating film.

18. A method of manufacturing a semiconductor device according to claim 14, wherein the edge portion of said gate electrode section is oxidized to fulfill the following expression:

$$\frac{r}{Tox} \geq \frac{\sqrt{1 + r/Tox1}}{\cosh^{-1}(1 + (Tox1/r))}$$

where r is the radius of curvature of the edge portion on the source region side of the gate electrode section, Tox is the thickness of the insulating film (in the central portion), and Tox1 is the thickness of the insulating film just under the edge portion of the gate electrode section.

19. A method of manufacturing a semiconductor device according to claim 14, wherein said SiON film prevents an oxidizing agent from being supplied to at least a side surface of said floating gate electrode section during said thermal oxidation process.

20. A method of manufacturing a semiconductor device according to claim 14, wherein said SiON film is turned into an oxide film by said thermal oxidation process.

21. A method of manufacturing a semiconductor device according to claim 14, wherein said thermal oxidation process is high-temperature dilute oxidation in which the temperature of annealing is 1000° C. or higher.

22. A method of manufacturing semiconductor device according to claim 14, wherein said thermal oxidation process is oxidation which is effected, with $NF_3$ gas applied to $O_2$ gas.

23. A method of manufacturing a semiconductor device, comprising:

a first step of forming a gate electrode section on an insulating film provided on a semiconductor substrate, the gate electrode section having a stacked gate structure in which a floating gate electrode, an interlayer insulating film, and a control gate electrode are provided;

a second step of forming an SiON film at least on a sidewall portion of said floating gate electrode by oxy-nitriding a side surface of said gate electrode section in an oxy-nitriding atmosphere, said SiON film having an oxidation prevention effect; and a third step of carrying out a thermal oxidation process after the second step to selectively promote oxidation at an edge portion of said floating gate electrode section adjacent to said insulating film.

24. A method of manufacturing a semiconductor device according to claim 23, further comprising a fourth step of forming an impurity diffused layer serving as a source region and a drain region at a surface of said semiconductor substrate, by using said gate elected section as a mask.

25. A method of manufacturing a semiconductor device according to claim 23, wherein said floating gate electrode contains phosphorus having a concentration of $5 \times 10^{20}$ $cm^{-3}$ or more.

26. A method of manufacturing a semiconductor device according to claim 23, wherein the edge portion of said gate electrode section is oxidized to fulfill the following expression:

$$r \geq 0.62 \, \text{Tox}$$

where r is the radius of curvature of the edge portion on the source region side of the gate electrode section, and Tox is the thickness of the insulating film.

27. A method of manufacturing a semiconductor device according to claim 23, wherein the edge portion of said gate electrode section is oxidized to fulfill the following expression:

$$\frac{r}{Tox} \geq \frac{\sqrt{1 + r/Tox1}}{\cosh^{-1}(1 + (Tox1/r))}$$

where r is the radius of curvature of the edge portion on the source region side of the gate electrode section, Tox is the thickness of the insulating film (in the central portion), and Tox1 is the thickness of the insulating film just under the edge portion of the gate electrode section.

28. A method of manufacturing a semiconductor device according to claim 23, wherein said SiON film is formed after the natural oxide film formed on the side surface of said gate electrode section has been removed.

29. A method of manufacturing a semiconductor device according to claim 30, wherein said SiON film prevents an oxidizing agent from being supplied to at least a side surface of said floating gate electrode during said thermal oxidation process.

30. A method of manufacturing a semiconductor device according to claim 23, wherein said SiON film is turned into an oxide film by said thermal oxidation process.

31. A method of manufacturing a semiconductor device according to claim 23, wherein said thermal oxidation process is high-temperature dilute oxidation in which the temperature of annealing is 1000° C. or higher.

32. A method of a manufacturing semiconductor device according to claim 23, wherein said thermal oxidation process is oxidation which is effected, with $NF_3$ gas applied to $O_2$ gas.

* * * * *